(12) United States Patent
Chang et al.

(10) Patent No.: US 6,320,434 B1
(45) Date of Patent: Nov. 20, 2001

(54) CIRCUIT AND METHOD FOR GENERATING A SYNCHRONOUS CLOCK SIGNAL

(75) Inventors: Jeff Chang, Taipei Hsien; Y. K. Chu, Hsin-Chu; Lilium Hsu, Taoyuan Shien, all of (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/590,505

(22) Filed: Jun. 9, 2000

Related U.S. Application Data
(60) Provisional application No. 60/140,394, filed on Jun. 22, 1999.

(51) Int. Cl.[7] ................................................ H03L 7/00
(52) U.S. Cl. ........................... 327/141; 327/172; 327/175
(58) Field of Search ................................... 327/131, 141, 327/72, 217, 170, 172, 175

(56) References Cited

U.S. PATENT DOCUMENTS

| | | | |
|---|---|---|---|
| 5,438,291 | * 8/1995 | Carbou et al. ...................... | 327/131 |
| 5,565,761 | 10/1996 | Hwang ................................. | 323/222 |
| 5,592,128 | 1/1997 | Hwang ................................. | 327/132 |
| 5,742,151 | 4/1998 | Hwang ................................. | 323/222 |
| 5,747,977 | 5/1998 | Hwang ................................. | 323/284 |
| 5,798,635 | 8/1998 | Hwang et al. ........................ | 323/222 |
| 5,811,999 | 9/1998 | Hall et al. ............................. | 327/156 |

OTHER PUBLICATIONS

ST L4981A/L4981B Data Sheet, "Power Factor Corrector," Sep. 1998, pp. 1–17.
Micro Linear ML4824 Data Sheet, "Power Factor Correction and PWM Controller Combo," Jun. 1998, pp. 1–16.
Micro Linear ML4821 Data Sheet, "Power Factor Controller," May 1997, pp. 1–12.

* cited by examiner

*Primary Examiner*—Dinh T. Le
(74) *Attorney, Agent, or Firm*—Pedro P. Hernandez; W. James Brady, III; Frederick J. Telecky, Jr.

(57) ABSTRACT

A method for generating a synchronous clock signal and a circuit (10) for implementing the method described. To generate the positive-going transition of the clock signal, the method generates a synchronization pulse train using a synchronization signal input. The method generates a second pulse train, having pulses offset in time from and later than those of the synchronization pulse train, to generate the negative-going transition of the clock signal. Because there is little loss in duty cycle, when the synchronous clock signal is input to a power factor correction ("PFC") and pulse width modulation ("PWM") controller circuit, the PFC and PWM controller is able to operate normally.

14 Claims, 5 Drawing Sheets

CIRCUIT AND METHOD FOR GENERATING A SYNCHRONOUS CLOCK SIGNAL

This application claims priority under 35 USC 119(e)(1) of provisional application No. 60/140,394 filed Jun. 22, 1999.

TECHNICAL FIELD OF THE INVENTION

This invention relates generally to the field of electronic clock generation circuits and methods. More specifically, this invention relates to the use of a method for generating a synchronous clock signal having an improved duty cycle. Such a clock signal may be used in a power factor correction and pulse width modulation controller used in computer display monitors.

BACKGROUND OF THE INVENTION

A PC video display monitor may have several resolutions because of various program requirements. An external synchronization signal is typically used to synchronize these resolutions. Each resolution typically has its own frequency, and the external synchronization signal pulse width may vary depending on its frequency. The frequency range is typically from 30 kHz to 95 kHz.

Power supplies in these display monitors typically use a technique called switched-mode pulse width modulation ("PWM"). Switched-mode PWM synchronizes the switching frequency of the power supply to the display monitor horizontal frequency in order to prevent picture interrupt and to address electromagnetic compatibility/electromagnetic interference (EMC/EMI) issues. Because the horizontal frequency is at least 30 kHz, the switching frequency of the power supply must be set to a frequency somewhat lower than 30 kHz.

With such a variety of frequencies and resolutions, it is difficult for one designing a power supply to use the external synchronization signal to synchronize the PWM controller power supply to the display monitor. One method of synchronizing these devices is to use the turns ratio method to extract from the yoke extra flyback voltage to generate a synchronous signal having an amplitude of about 30V. However, this signal requires a resistor/capacitor network to reduce the voltage level and improve its shape.

Another synchronization method requires a synchronization signal having a clock width of approximately 1 μs or more and an amplitude exceeding a certain voltage. Such a method is used by SGS-Thomson Microelectronics in its L4981A Power Factor Corrector ("PFC") integrated circuit. The L4981A requires the external synchronization pulse width to be greater than 800 ns and the signal voltage to be greater than 3.5V. In that scenario, as shown in the timing diagram in FIG. 1, a ramp waveform used by the circuit to generate an output clock signal must be kept low until the external synchronization pulse ends, reducing the duty cycle of the output clock. FIG. 1(*a*) shows the external synchronization signal, SYNC. FIG. 1(*b*) shows a ramp voltage waveform $V_T$ which has a slope controlled by an RC time constant. FIG. 1(*c*) shows the output that is used in the PFC circuit. When SYNC is low ("asynchronous operation"), $V_T$ ramps up. When $V_T$ is greater than a preset low threshold voltage 118, the output is high. As soon as $V_T$ crosses a preset high threshold voltage 112, the output goes low, causing $V_T$ to ramp downward. When $V_T$ crosses low threshold voltage 118, the output goes high which reverses the ramp waveform and the cycle repeats. As shown in FIG. 1, the output has a duty cycle of approximately 87% between times $t_0$ and $t_1$.

When the SYNC signal begins cycling ("synchronous operation"), a high SYNC signal causes $V_T$ to ramp downward and the output to go low. However, unlike before when $V_T$ crossed low threshold voltage 118 and caused the output to go high, when SYNC is high, the output remains low. This prior art synchronization method requires the SYNC signal to be high for at least time interval 124, between times $t_2$ and $t_4$, and $V_T$ must be kept low during time interval 130, from time $t_3$ to time $t_4$, until the SYNC pulse ends. The L4981A requires that time interval 124 be at least 800 ns, and it is typically more. Because of this restriction, the duty cycle of the output may be reduced significantly, to, for example, approximately 60% between times $t_4$ and $t_5$.

SUMMARY OF THE INVENTION

Therefore, a need has arisen for an improved synchronous clock generation circuit and method which allow a synchronization signal to be used without sacrificing duty cycle.

In accordance with the present invention, a circuit for generating a synchronous clock signal includes a synchronization circuit, a ramp and pulse generator, and a clock generator. A synchronization signal and the fed-back synchronous clock signal are inputs to the synchronization circuit which generates a first pulse train. The synchronous clock signal is also fed back to the ramp and pulse generator to generate a second pulse train which includes pulses which are offset in time from the first pulse train pulses. The first and second pulse trains are provided to the clock generator to generate the synchronous clock signal which has a duty cycle that is nearly equal to the duty cycle of an asynchronous clock signal generated in the absence of a synchronization signal.

Preferably, each pulse of the first pulse train generates a positive-going transition for the synchronous clock signal, and each pulse of the second pulse train generates a negative-going transition for the synchronous clock signal.

More specifically, in accordance with one embodiment of the present invention, the synchronization circuit may include an inverter, an S-R latch, and a NOR gate. The synchronization signal is an input to the inverter, and the inverter's output is connected to the R input of the latch. The synchronous clock signal is fed back to the S input of the latch, and the non-inverting output of the latch is connected to one input of the NOR gate. The other input of the NOR gate is the output of the inverter. The output of the NOR gate provides the synchronization circuit pulse train.

The ramp and pulse generator of this embodiment includes a ramp generator and a pulse generator. The ramp generator includes a bipolar junction transistor whose base is connected to the fed-back synchronous clock signal, whose emitter is grounded, and whose collector is connected to the pulse generator. A discharge capacitor is connected between the collector and ground, and a pull-up resistor is connected between the collector and a supply voltage. The pulse generator includes a voltage comparator, the inverting input of which is connected to the collector of the transistor of the ramp generator. The non-inverting input of the voltage comparator is coupled to a reference voltage. The voltage comparator generates the second pulse train. Preferably, the voltage across the capacitor does not have to remain at zero volts until a pulse from the synchronization signal ends.

The clock generator of this embodiment includes an S-R latch. The first pulse train is coupled to the S input of the latch, and the second pulse train is coupled to the R input. The output of the S-R latch is the synchronous clock signal.

In a preferred embodiment of the present invention, an external reference voltage may be input to the circuit.

The synchronous clock signal is preferably used in a second circuit that performs power factor correction and controls pulse width modulation.

Also in accordance with the present invention, a circuit for generating a clock signal capable of having synchronous and asynchronous portions includes a synchronization circuit, a ramp and pulse generator, and a clock generator. A synchronization signal and the fed-back clock signal are inputs to the synchronization circuit which generates a first pulse train. The clock signal is also fed back to the ramp and pulse generator to generate a second pulse train, which includes pulses which are offset in time from the first pulse train pulses, and a third pulse train, which includes pulses earlier in time than those of the second pulse train. The first, second, and third pulse trains are provided to the clock generator to generate the clock signal, as follows. Each pulse of the first pulse train generates a positive-going transition for the synchronous portion of the clock signal, each pulse of the third pulse train generates a positive-going transition for the asynchronous portion of the clock signal, and each pulse of the second pulse train generates a negative-going transition for both the synchronous and asynchronous clock signal portions. The clock signal has a duty cycle that is nearly equal to the duty cycle of the asynchronous clock signal portion generated in the absence of the synchronization signal.

In a preferred embodiment of the method of the present invention, the method for generating the synchronous clock signal includes generating a first pulse train using the synchronous clock signal and a synchronization signal, in which each pulse of the first pulse train generates a positive-going transition for the synchronous clock signal, and generating a second pulse train using the synchronous clock signal, in which the pulses of the second pulse train are offset in time from and later than pulses of the first pulse train, each pulse of the second pulse train generates a negative-going transition for the synchronous clock signal, and the duty cycle of the synchronous clock signal is nearly equal to the duty cycle of an asynchronous clock signal generated in the absence of the synchronization signal.

Preferably, the method also includes generating a ramp signal which is used to generate the second pulse train. Preferably, a portion of each period of the ramp signal does not have to remain at zero volts until an associated pulse from the first pulse train ends. More specifically, a reference voltage is used to generate the second pulse train.

Also in accordance with the present invention, a method for generating a clock signal capable of having synchronous and asynchronous portions includes generating a first pulse train using the clock signal and a synchronization signal, generating second and third pulse trains using the clock signal, and generating a ramp signal which is used to generate the third pulse train. Each pulse of the first pulse train generates a positive-going transition for the synchronous portion of the clock signal and each pulse of the second pulse train generates a positive-going transition for the asynchronous portion of the clock signal. The pulses of the third pulse train are offset in time from and later than pulses of the first and second pulse trains, and each pulse of the third pulse train generates a negative-going transition for the synchronous and asynchronous portions of the clock signal. In this method, a portion of each period of the ramp signal does not have to remain at zero volts until an associated pulse from the first pulse train ends.

Preferably, a reference voltage is used to generate the second pulse train.

The present invention provides various technical advantages. As used in a PFC/PWM controller circuit, one technical advantage is that a synchronous clock signal is generated that is not affected by the width of the synchronization signal. The duty cycle of the clock signal is not significantly decreased as compared to the asynchronous clock signal. Such an advantage retains the PWM turn-on duty cycle in the power supply applications.

Other technical advantages of the present invention will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 2A:
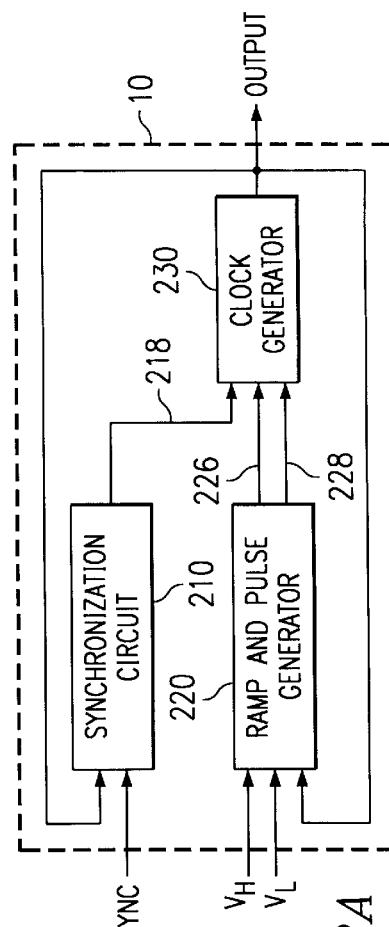
FIG. 2A is a block diagram of a clock generation circuit in accordance with one embodiment of the present invention.

FIG. 2A is a block diagram illustrating a clock generation circuit in accordance with one embodiment of the present invention. The circuit may have three inputs, a synchronization signal, SYNC, a high threshold voltage, and a low threshold voltage. The circuit generates a clock signal which is preferably inverted before being provided to a power factor correction/pulse width modulation controller. The clock signal is "asynchronous" when there is no synchronization signal, and "synchronous" when the clock signal is generated in response to a synchronization signal.

In a power supply application for a video display monitor, the synchronization signal varies based on the resolution and the frequency of the monitor. The typical frequency range of the synchronization signal is from 30 kHz to 100 kHz. The PFC/PWM controller synchronizes the switching frequency of the power supply to the display monitor horizontal frequency. The duty cycle of the synchronous clock signal generated using the present invention is not substantially less than that of an asynchronous clock signal, yet having a synchronous clock signal properly synchronizes the power supply to the monitor frequency.

The clock generation circuit 10 shown in FIG. 2A includes three main parts: a synchronization circuit 210, a ramp and pulse generator 220, and a clock generator 230. The inputs to synchronization circuit 210 are the synchronization signal, SYNC, and the output clock signal, the latter being fed back from clock generator 230. Synchronization circuit 210 generates a train of pulses 218 having the same frequency as the synchronization signal. As will be seen shortly, synchronization circuit 210 acts as a "one-shot" generator producing pulses typically having widths on the order of less than 100 ns. Each pulse of the synchronization pulse train provides the trigger for the rising edge of the synchronous output clock signal.

Figure 2B:
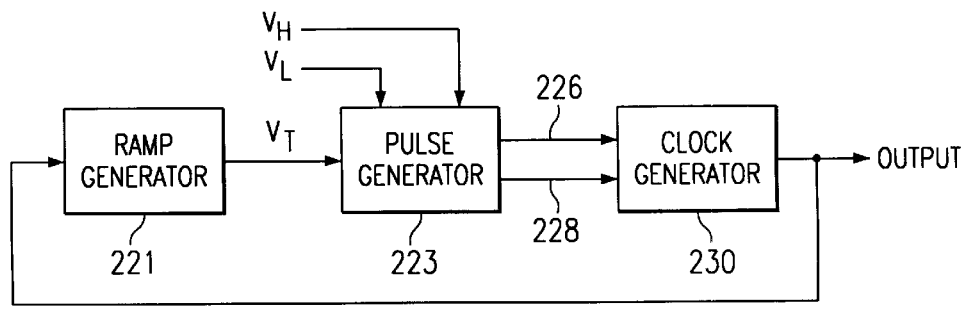
FIG. 2B is a block diagram of the ramp and pulse generator of FIG. 2A.

The inputs to ramp and pulse generator 220 are high threshold voltage $V_H$, low threshold voltage $V_L$, and the output clock signal, the latter again being fed back from clock generator 230. As shown in FIG. 2B, ramp and pulse generator 220 includes ramp generator 221 and pulse generator 223. Ramp generator 221 generates ramp waveform $V_T$ and provides it to pulse generator 223 which generates two pulse trains 226 and 228. First pulse train 228 is generated regardless of whether there is a synchronization signal. Pulse train 228 has the same frequency as the synchronization signal. Each pulse of pulse train 228 provides the trigger for the falling edge of the output clock signal. Second pulse train 226 is generated only when the synchronization signal is absent. Similar to synchronization circuit pulse train 218, each pulse of pulse train 226 provides the trigger for the rising edge of the asynchronous output clock signal.

Clock generator 230 generates the output clock signal by using either synchronization circuit pulse train 218 or pulse train 226 as the trigger for the rising edge of the clock, depending on whether the synchronization signal is present or absent, respectively, and by using pulse train 228 as the trigger for the falling edge of the clock. When the synchronization signal is present, the frequency of the output clock signal is the same as that of the synchronization signal.

Figure 2C:
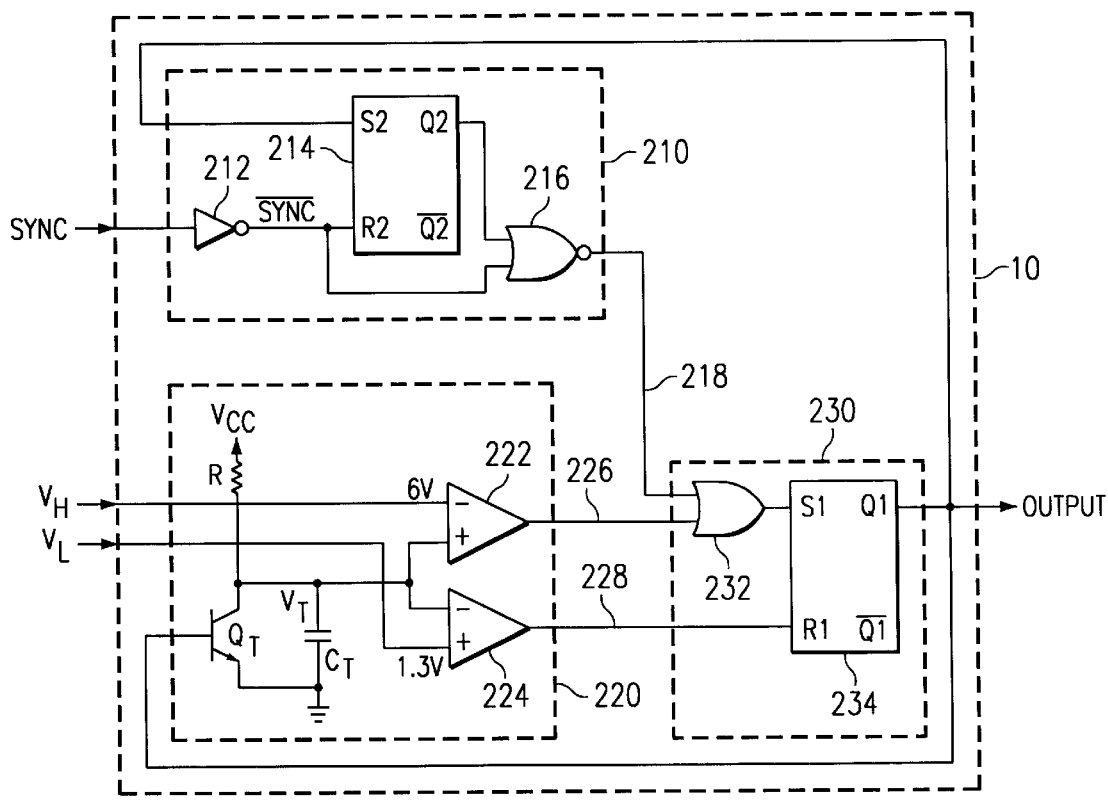
FIG. 2C is a circuit diagram of the block diagram of FIG. 2A.

FIG. 2C is a circuit diagram of the block diagram of FIG. 2A and illustrates the electronic elements used in the this embodiment of the present invention. Synchronization circuit 210 may include inverter 212, S-R latch 214, and NOR gate 216. The synchronization signal is inverted by inverter 212 and the inverted signal is provided to the R2 input of S-R latch 214 and to an input of NOR gate 216. The output clock signal that is fed back to synchronization circuit 210 is provided to the S2 input of S-R latch 214. The output Q2 of S-R latch 214 is provided to the second NOR gate input, and the NOR gate output provides synchronization pulse train 218 to clock generator 230.

Ramp and pulse generator 220 includes bipolar transistor $Q_T$, discharge capacitor $C_T$, pull-up resistor R to supply voltage VCC, high threshold voltage comparator 222, and low threshold voltage comparator 224. The output clock signal is fed back to the base of $Q_T$, whose emitter is grounded and whose collector is connected to ground via $C_T$. The collector, whose voltage is $V_T$, threshold voltage comparator 222 and to the inverting input of low threshold voltage comparator 224. $V_{CC}$ can be between 12 and 20V and is typically 15V. As shown in FIG. 2C, $V_H$ equals 6V and is provided to the inverting input of high threshold voltage comparator 222. $V_L$ equals 1.3V and is provided to the non-inverting input of low threshold voltage comparator 224. These threshold values are based on the integrated circuit technology used. It is not necessary for the high and low threshold voltages to be separate inputs. Instead, a resistive divider can be designed having a resistor between $V_{CC}$ and $V_H$, one between $V_H$ and $V_L$, and one between $V_L$ and ground. By appropriately choosing the three resistors, the high and low threshold voltages can be generated. High threshold voltage comparator 222 generates pulse train 226 and provides it to clock generator 230, and low threshold voltage comparator 224 generates pulse train 228 and provides it to clock generator 230. In an alternative embodiment (not shown), instead of using a common-emitter configuration using pull-up resistor R, $Q_T$ can be set up in an emitter-follower configuration. In such a scenario, $C_T$ and R are connected in parallel between the emitter and ground, and the collector is connected directly to $V_{CC}$.

Clock generator 230 includes OR gate 232 and S-R latch 234. Synchronization circuit pulse train 218 and pulse train 226 are provided to the inputs of OR gate 232 whose output is provided to the S1 input of S-R latch 234. Pulse train 228 is provided to the R2 input of S-R latch 234. The output Q1 of S-R latch 234 is the desired output clock signal.

Figure 4:
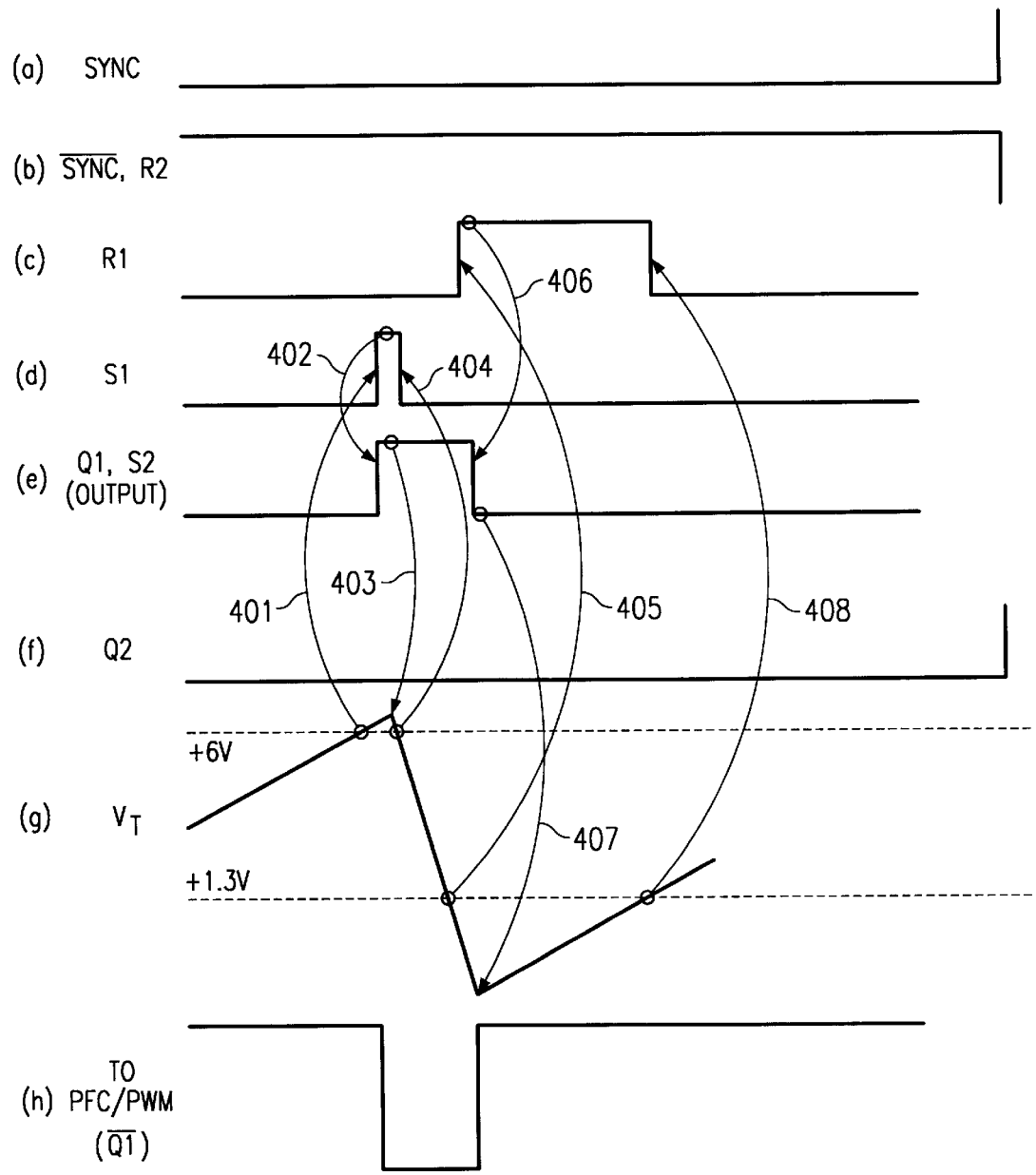
FIG. 4 is a magnified view of the timing relationships occurring in the circuit illustrated in FIGS. 2A and 2C when no synchronization signal is present.
Figure 5:
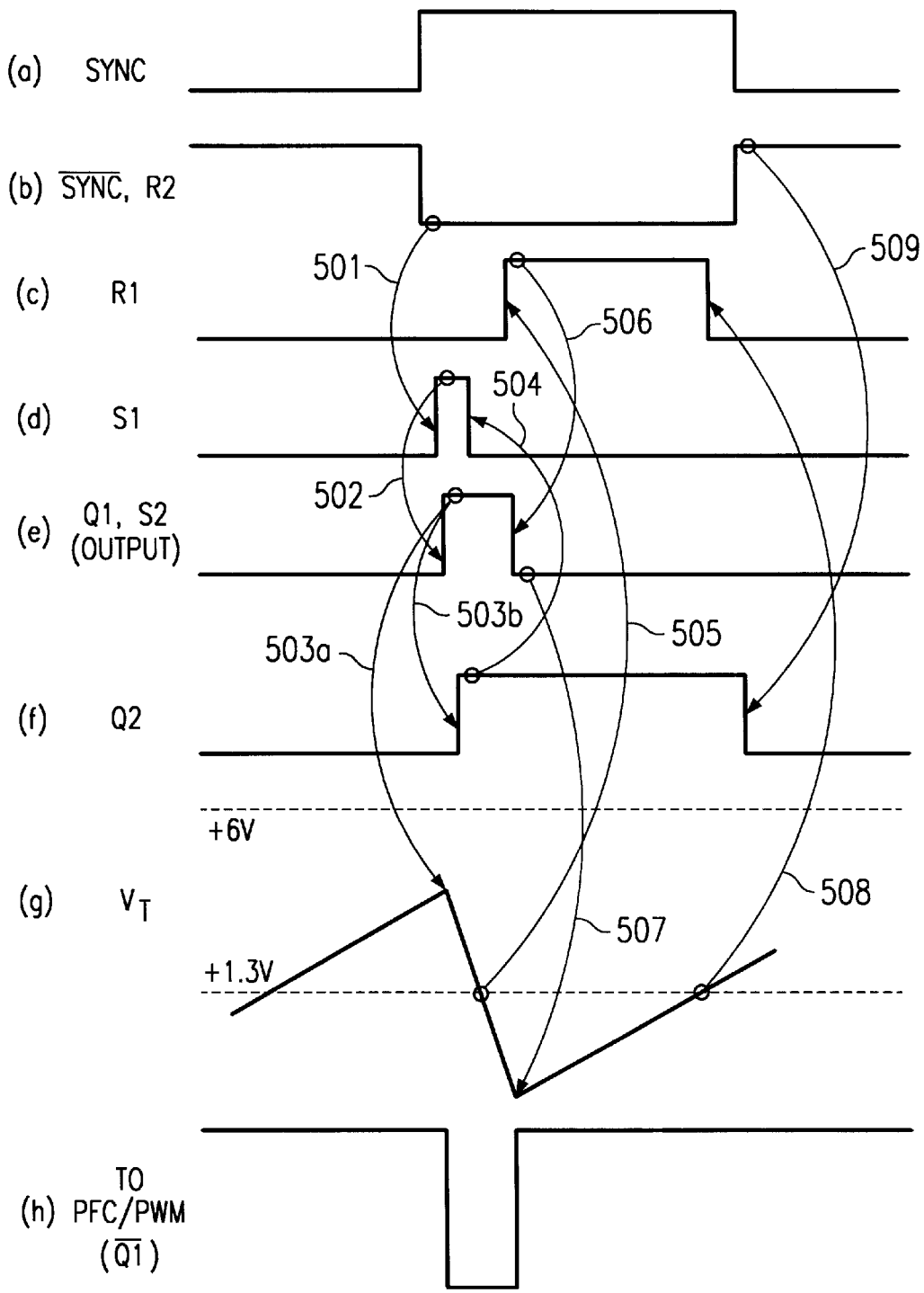
FIG. 5 is a magnified view of the timing relationships occurring in the circuit illustrated in FIGS. 2A and 2C when a synchronization signal is present.

With the help of a general timing diagram in FIG. 3 and magnified timing diagrams in FIGS. 4 and 5 (not to scale), the operation of clock generation circuit 10 will now be explained. In this example, $V_H$=6V and $V_L$=1.3V. When the SYNC signal is low, $\overline{SYNC}$ goes high forcing the output of the NOR gate low, effectively taking synchronization circuit 210 out of clock generation circuit 10 and causing the circuit to generate an asynchronous clock. Input S1 of S-R latch 234 now follows the output of high voltage comparator 222. With SYNC low, and starting with the output Q1 going low, bipolar transistor $Q_T$ is turned off and collector voltage $V_T$ tries to immediately go high. However, discharge capacitor $C_T$ prevents $V_T$ from instantaneously changing, and while $C_T$ charges, $V_T$ ramps up. Although not explicitly shown in FIGS. 3–5, the slope of the ramp is exponential based on the values of R and $C_T$. If the emitter-follower configuration were used instead of the common-emitter configuration, the resulting operation of the circuit would be similar, except that the $V_T$ waveform would be inverted (i.e., $V_T$ would slope downward when Q1 is low). $V_T$ is compared to $V_L$ in low threshold comparator 224. The output of low threshold voltage comparator 224 is low when $V_T$ is greater than $V_L$ and high when $V_T$ is less than $V_L$. $V_T$ is also compared to $V_H$ in high threshold voltage comparator 222. The output of high threshold voltage comparator 222 is low when $V_T$ is less than $V_H$ and high when $V_T$ is greater than $V_H$. Thus, when $V_T$ is between $V_H$ and $V_L$, both comparator outputs are low. This keeps S1 and R1 low, and Q1 does not change.

When $V_T$ crosses above $V_H$, the output of high threshold comparator 222 goes high forcing S1 high (step 401). This forces Q1 high (step 402), which turns on $Q_T$ and causes $V_T$ to move down toward its saturation voltage (typically ~0.2 V) (step 403). However, $C_T$ prevents $V_T$ from instantaneously changing, and while $C_T$ discharges, $V_T$ ramps down. As soon as $V_T$ goes below $V_H$, S1 again goes low (step 404) and Q1 remains high. $V_T$ continues to ramp down, and when $V_T$ crosses below $V_L$, low voltage threshold comparator 224 goes high, forcing R1 high (step 405) which forces Q1 low (step 406). This causes $Q_T$ to turn off which causes $V_T$ to move toward $V_{CC}$ and ramp up (step 407). When $V_T$ rises above $V_L$, R1 goes low (step 408) and Q1 remains low.

It can be seen that the rising edge of each pulse of pulse train 226 from high voltage comparator 222 causes S1 to go high (step 401) generating a positive-going transition for the output clock signal Q1. Each pulse of pulse train 226 is high for as long as $V_T$ is greater than $V_H$. Similarly, it can be seen that the rising edge of each pulse of pulse train 228 from low voltage comparator 224 causes Q1 to go low (step 406) generating a negative-going transition for the output clock signal Q1. Each pulse of pulse train 228 is high for as long as $V_T$ is less than $V_L$.

This cycle continues as $V_T$ ramps up and down. Thus, Q1 is low when $V_T$ ramps up and is high when $V_T$ ramps down.

Figure 3:
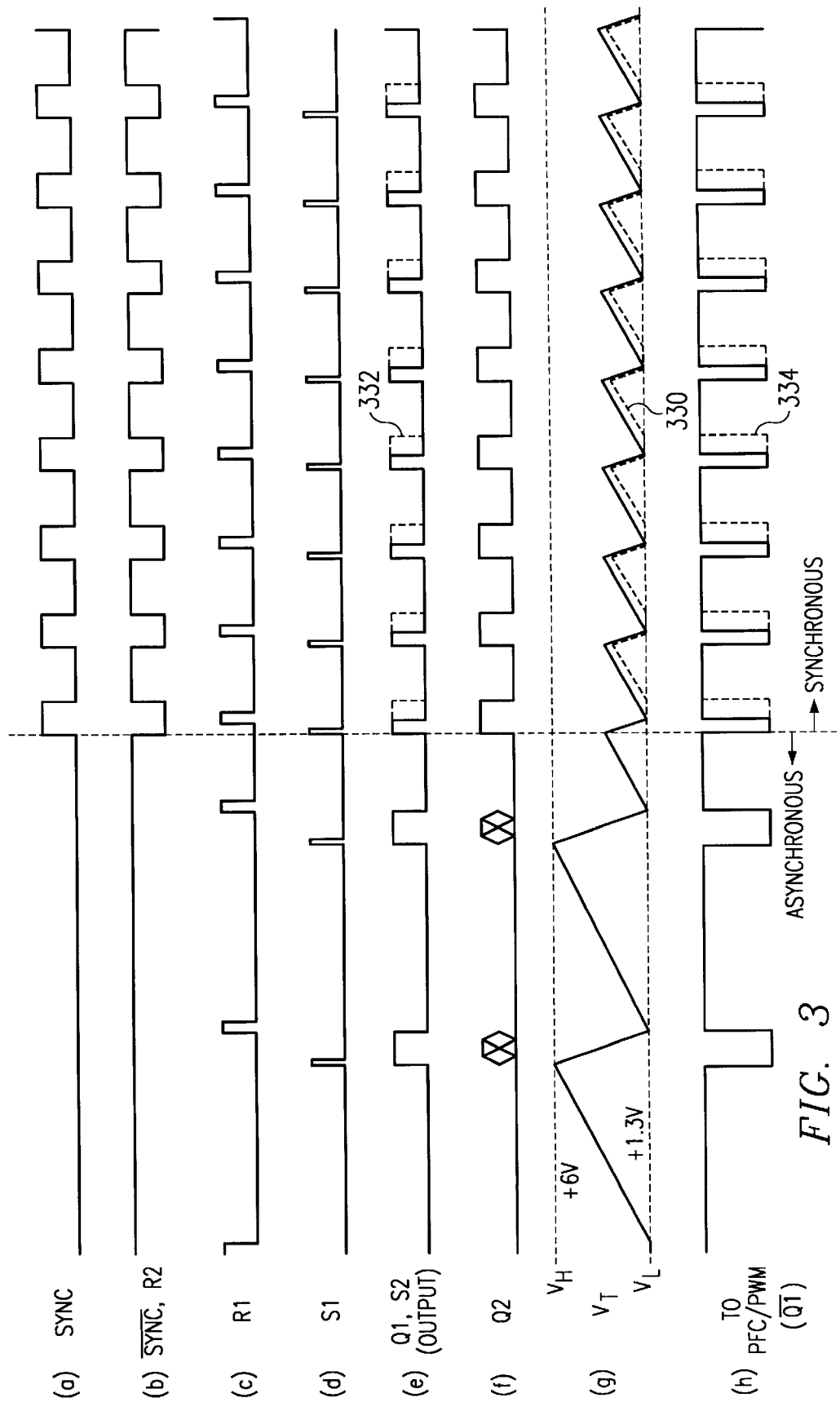
FIG. 3 illustrates a timing diagram of the circuit illustrated in FIGS. 2A and 2C.

The output clock signal Q1 is inverted and amplified (as illustrated in FIG. 3(h)) and provided to the PFC/PWM controller. The duty cycle of the PFC/PWM control signal is based on the time constants for the ramp-up and the ramp-down of $V_T$. If the ramp-up time is 20 μs and the ramp-down time is 5 μs, the duty cycle is 20/25=80%. As shown in FIG. 3, the asynchronous portion of the PFC/PWM control signal has a duty cycle of approximately 83%.

When the SYNC signal is high, the synchronization circuit 210 takes an active role in generating the output clock signal Q1. When SYNC goes high, $\overline{SYNC}$ and R2 go low, and NOR, gate 216 generates the inverse of Q2 (i.e. $\overline{Q2}$). Q2 and Q1 are initially low. With Q1/S2 low and R2 low, Q2 does not change and remains low causing the output of NOR gate 216 (i.e. the output of synchronization circuit 210) high. This causes S1 to go high (step 501). As with the asynchronous operation, S1 going high (while R1 is low) causes Q1 to go high (step 502). This turns on $Q_T$ and causes $V_T$ to ramp down (step 503a). In addition, when Q1 goes high, S2 goes high which, because R2 is low, forces Q2 high (step 503b). Because NOR gate 216 acts as an inverter, the output 218 goes low forcing S1 low (step 504) because $V_T$ is below $V_H$. As with asynchronous operation, when S1 goes low, Q1 remains the same until $V_T$ crosses below $V_L$, forcing R1 high (step 505) which forces Q1 low (step 506). Q2 still remains high because both R2 and S2 are low. When Q1 goes low, $Q_T$ turns off, causing $V_T$ to ramp up (step 507). When $V_T$ crosses above $V_L$, Ri goes low (step 508). Finally, SYNC goes low forcing $\overline{SYNC}$ and R2 high which forces Q2 low (step 509). The inputs to S-R latch 214 remain the same until either SYNC goes high or $V_T$ crosses $V_H$. Therefore, in order to control the output clock signal using the synchronization signal, the frequency of the SYNC signal must be greater than that of the ramp waveform during asynchronous operation.

In synchronous operation, the frequency of the output clock signal increases to that of the SYNC signal. Each time $\overline{SYNC}$ goes low, a pulse is formed in pulse train 218 at the output of synchronization circuit 210 which causes S1 to go high (step 501), generating a positive-going transition for the output clock signal Q1. As with asynchronous operation, the rising edge of each pulse of pulse train 228 from low voltage comparator 224 causes Q1 to go low (step 506) generating a negative-going transition for the output clock signal Q1. As before, each pulse of pulse train 228 is high for as long as $V_T$ is less than $V_L$.

Because the times during which $V_T$ ramps up and down are not as long during synchronous operation, the output clock signal frequency is greater and the positive pulses in Q1 do not last as long. This is beneficial for the PFC/PWM control signal which is the inverted and amplified Q1, because the turn-off time of the PFC/PWM signal is reduced. Thus, the duty cycle of the PFC/PWM control signal remains nearly the same as compared to what it was under asynchronous operation. As shown in FIG. 3, the synchronous portion of the PFC/PWM control signal still has a duty cycle of approximately 83%.

Figure 1:
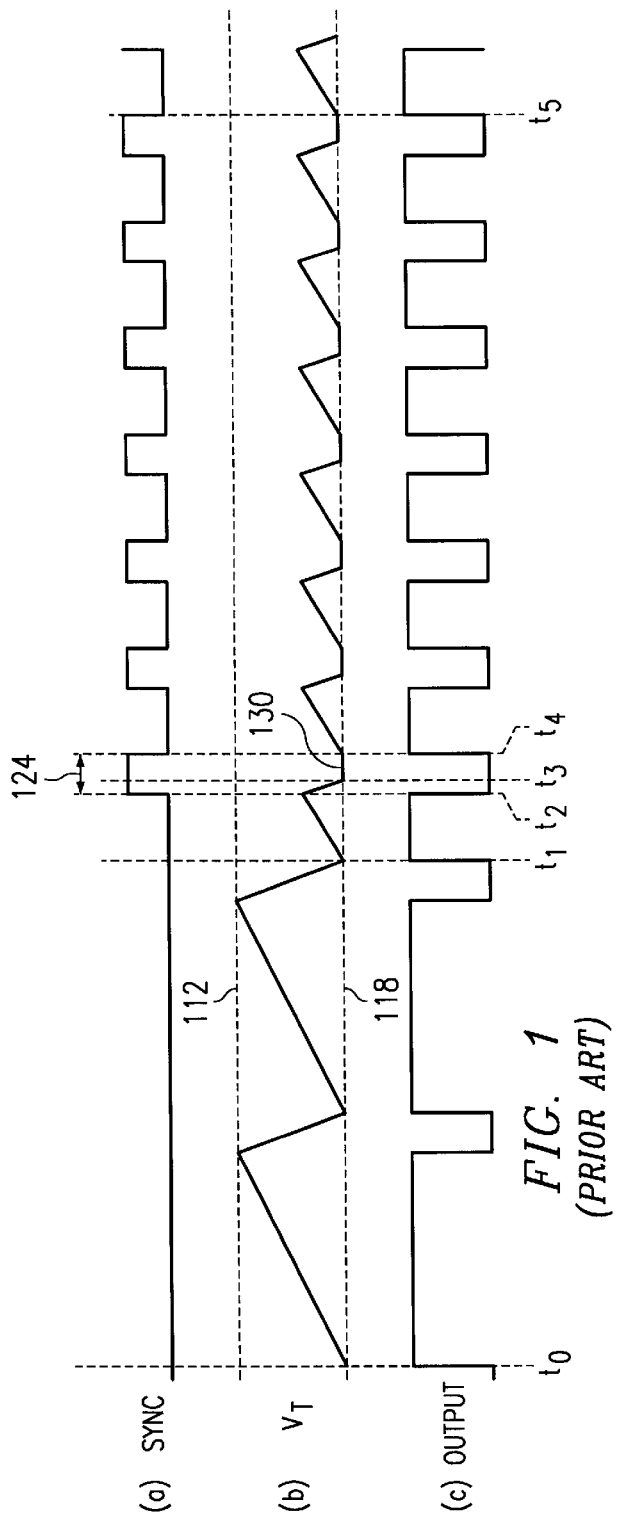
FIG. 1 shows a timing diagram of a prior art clock generation circuit.

The duty cycle of this synchronous output can be compared to that of the prior art previously described. The prior art required that the SYNC signal remain high for at least time interval 124 (in FIG. 1) and that $V_T$ remain low during time interval 130 until the SYNC pulse ends. Thus, according to the prior art, $V_T$ would appear as shown by trace 330, causing the on-time of Q1 to increase as shown by trace 332, which in turn decreases the turn-on time for the PFC/PWM control signal as shown in trace 334. As shown in FIG. 3(h), the duty cycle of trace 334 is less than 60%, as compared with 83% for the synchronous PFC/PWM control signal according to the present invention.

The use of this invention is not limited to power supplies for PC display monitors. Such a circuit and method could be used for control of power supplies for other applications.

Although the present invention has been described in detail, it should be understood that various changes, substitutions, and alterations can be made hereto without departing from the spirit and scope of the invention as defined by the appended claims.

What is claimed is:

1. A circuit for generating a synchronous clock signal, said circuit having an external synchronization signal as an input, said circuit comprising:
    a synchronization circuit, to which said synchronous clock signal is fed back, that uses said synchronization signal to generate a first train of pulses;
    a ramp and pulse generator, to which said synchronous clock signal is fed back, that generates a second train of pulses offset in time from said first pulse train; and
    a clock generator having as inputs said first and second pulse trains and generating said synchronous clock signal.

2. The circuit according to claim 1, wherein each pulse of said first pulse train generates a positive-going transition for said synchronous clock signal, and each pulse of said second pulse train generates a negative-going transition for said synchronous clock signal.

3. The circuit according to claim 1, wherein said synchronization circuit comprises:
    an inverter having as an input said synchronization signal;
    an S-R latch including an S input and an R input and having as its S input said synchronous clock signal and as its R input the output of said inverter; and
    a NOR gate having as inputs the non-inverting output of said S-R latch and the output of said inverter, the output of said NOR gate providing said first pulse train.

4. The circuit according to claim 1, wherein said ramp and pulse generator comprises a ramp generator and a pulse generator,
    wherein said ramp generator comprises:
        a bipolar junction transistor having a base coupled to said synchronous clock signal, an emitter coupled to ground, and a collector coupled to said pulse generator;
        a discharge capacitor connected between said collector and ground; and
        a pull-up resistor connected between said collector and a supply voltage; and wherein said pulse generator comprises:
        a voltage comparator having an inverting input coupled to said collector and a non-inverting input coupled to a reference voltage, said voltage comparator generating said second pulse train.

5. The circuit according to claim 4, wherein there is a voltage across the discharge capacitor and the voltage does not have to remain at zero volts until a pulse of said synchronization signal ends.

6. The circuit according to claim 1, wherein said clock generator comprises an S-R latch including an S input and an R input and having as its S input said first pulse train and as its R input said second pulse train, and having as an output said synchronous clock signal.

7. The circuit according to claim 1, wherein a reference voltage is input to said circuit.

8. A circuit for generating a clock signal having synchronous and asynchronous portions, said circuit comprising:

a synchronization circuit having as inputs a synchronization signal and said clock signal, said synchronization circuit generating a first train of pulses;

a ramp and pulse generator, having as an input said clock signal, for generating a second train of pulses offset in time from said first pulse train, and generating a third train of pulses earlier in time than that of said second pulse train; and a clock generator having as inputs said first, second, and third pulse trains, wherein each pulse of said first pulse train generates a positive-going transition for said synchronous clock signal portion, each pulse of said third pulse train generates a positive-going transition for said asynchronous clock signal portion, and each pulse of said second pulse train generates a negative-going transition for said synchronous and asynchronous clock signal portions, said clock generator generating said clock signal.

9. A method for generating a synchronous clock signal, said method comprising the steps of:

generating a first pulse train using said synchronous clock signal and a synchronization signal with a synchronization circuit, each pulse of said first pulse train generating a positive-going transition for said synchronous clock signal;

generating a second pulse train using said synchronous clock signal with a ramp circuit, said second pulse train having pulses offset in time from and later than pulses of said first pulse train, each pulse of said second pulse train generating a negative-going transition for said synchronous clock signal; and generating said synchronous clock signal using said first pulse train and said second pulse train.

10. The method according to claim 9, further comprising the step of generating a ramp signal which is used to generate said second pulse train.

11. The method according to claim 9, wherein a portion of each period of said ramp signal does not have to remain at zero volts until an associated first pulse train pulse ends.

12. The method according to claim 9, wherein said second pulse train generating step uses a reference voltage to generate said second pulse train.

13. A method for generating a clock signal having synchronous and asynchronous portions, said method comprising the steps of:

generating a first pulse train using said clock signal and a synchronization signal with a synchronization circuit, each pulse of said first pulse train generating a positive-going transition for said synchronous clock signal portion;

generating a second pulse train using said clock signal with a ramp circuit, each pulse of said second pulse train generating a positive-going transition for said asynchronous clock signal portion;

generating a third pulse train using said clock signal with said ramp circuit, said third pulse train having pulses offset in time from and later than pulses of said first and second pulse trains, each pulse of said third pulse train generating a negative-going transition for said synchronous and asynchronous clock signal portions;

generating a ramp signal which is used to generate said third pulse train;

generating said clock signal using said first, second and third pulse trains; and wherein a portion of each period of said ramp signal does not have to remain at zero volts until an associated first pulse train pulse ends.

14. The method according to claim 13, wherein said second pulse train generating step uses a reference voltage to generate said second pulse train.

* * * * *